United States Patent
Kurz et al.

(10) Patent No.: US 10,345,705 B2
(45) Date of Patent: Jul. 9, 2019

(54) PHOTOLITHOGRAPHIC PATTERNING OF A CYLINDER

(71) Applicant: XEROX CORPORATION, Norwalk, CT (US)

(72) Inventors: Karl E. Kurz, Rochester, NY (US); Amir Prizant, Rochester, NY (US); Christopher D. Blair, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 1107 days.

(21) Appl. No.: 13/940,315

(22) Filed: Jul. 12, 2013

(65) Prior Publication Data

US 2015/0017588 A1    Jan. 15, 2015

(51) Int. Cl.
| | | |
|---|---|---|
| *G03F 7/40* | (2006.01) | |
| *G03F 7/24* | (2006.01) | |
| *G03G 15/08* | (2006.01) | |
| *G03G 15/09* | (2006.01) | |

(52) U.S. Cl.
CPC .......... *G03F 7/40* (2013.01); *G03F 7/24* (2013.01); *G03G 15/0808* (2013.01); *G03G 15/0921* (2013.01)

(58) Field of Classification Search
CPC .......... H01L 21/3105; H01L 21/0337
USPC ................................. 430/316, 318
See application file for complete search history.

(56) References Cited

U.S. PATENT DOCUMENTS

| | | | |
|---|---|---|---|
| 6,032,004 A | 2/2000 | Mirabella, Jr. et al. | |
| 6,274,294 B1 | 8/2001 | Hines | |
| 6,420,090 B1 * | 7/2002 | Kojima et al. | 430/284.1 |
| 7,407,737 B2 | 8/2008 | Meisel et al. | |
| 7,828,707 B2 * | 11/2010 | Lee et al. | 492/9 |
| 8,027,086 B2 | 9/2011 | Guo et al. | |
| 8,394,244 B1 | 3/2013 | Patterson | |
| 2010/0314785 A1 | 12/2010 | Usami | |
| 2013/0022764 A1 | 1/2013 | Chou et al. | |
| 2013/0052294 A1 | 2/2013 | Wang et al. | |

FOREIGN PATENT DOCUMENTS

EP        0 385 013        6/1999

* cited by examiner

*Primary Examiner* — Daborah Chacko-Davis
(74) *Attorney, Agent, or Firm* — Gibb & Riley, LLC

(57) ABSTRACT

Methods herein form a photoresist on an exterior of a cylinder and expose the photoresist to a light source while rotating the cylinder. Such methods develop the photoresist, after exposing, to change the photoresist into a patterned protective layer on the exterior of the cylinder. Then, these methods pattern the exterior of the cylinder while rotating the cylinder using the patterned protective layer to produce a patterned cylinder.

22 Claims, 7 Drawing Sheets

PHOTOLITHOGRAPHIC PATTERNING OF A CYLINDER

BACKGROUND

Devices and methods herein generally relate to patterned items and patterning processes and more particularly to patterning that rotates a cylinder during photolithographic processing.

In common printers, a laser beam projects a latent image of the page to be printed onto an electrically charged rotating drum. Photoconductivity allows charge to leak away from the areas exposed to light. Powdered ink (toner) particles are then electrostatically picked up by the drum's charged areas, which have not been exposed to light. The drum then prints the image onto paper by direct contact and heat, which fuses the ink to the paper.

Magnetic rollers are used in printing devices to deliver toner to the development device (to the drum). In particular, a toner delivery device, commonly called semiconductive magnetic brush development (SCMB) uses a fixed magnet surrounded by a rotating sleeve to develop a latent image on a photoreceptor. A parameter of such a device is commonly called mass on roll (MOR), which refers to the amount of developer on the roller sleeve available for development. The mass on roll is adjusted by controlling the magnetic field produced by the fixed magnet, the developer bias, and the position of a trim bar. Often, sleeves are grit blasted to introduce a randomized defect pattern, or sleeves are machined to produce a grooved surface.

However, grit blasting and machining the sleeve is expensive. Sleeves can also be extruded; however, the extruding process limits the design freedom of the pattern on the surface to two dimensions and thereby forming the same uniform pattern down the entire length of the sleeve.

SUMMARY

Exemplary methods herein form a photoresist on a cylinder (e.g., full rotational exterior of a printer magnetic roller) and expose the photoresist to a light source while rotating the cylinder (e.g., at least one full revolution). Such methods develop the photoresist, after exposing, to change the photoresist into a patterned protective layer on the exterior of the cylinder. Then, these methods pattern the exterior of the cylinder while rotating the cylinder (e.g., at least one full revolution) using the patterned protective layer to produce a patterned cylinder. The exposure process can direct a pattern of laser light on the photoresist from a fixed position as the cylinder rotates. Alternatively, the exposure process can expose a pattern of light on the photoresist through an optical mask (surrounding the cylinder) from a fixed position as the cylinder rotates.

A printer magnetic roller produced by such methods comprises a fixed magnetic core and a patterned cylinder surrounding the fixed magnetic core. The pattern produced on the cylinder can, for example, comprise a pattern that varies along the length of the printer magnetic roller. In one example, the pattern can comprise a helix pattern of increasing pitch on the exterior of the printer magnetic roller. Such a pattern is useful because it can induce directional flow of toner on a patterned printer magnetic roller. More specifically, the helix pattern of increasing pitch causes toner on the patterned printer magnetic roller to flow towards one end of the patterned printer magnetic roller. In another example, the pattern on the exterior of the printer magnetic roller has a sinusoidal frequency, amplitude, and groove spacing producing a transfer function of toner that provides optimal mass on roller (MOR) and minimizes visible noise.

These and other features are described in, or are apparent from, the following detailed description.

BRIEF DESCRIPTION OF THE DRAWINGS

Various exemplary devices and methods are described in detail below, with reference to the attached drawing figures, in which.

DETAILED DESCRIPTION

As mentioned above, grit blasting, machining, and extruding process for printer magnetic rollers can be expensive and have limitations. Therefore, the devices and methods herein provide photolithographic processes to produce patterns on magnetic roll surfaces that are not attainable through traditional machining or extrusion. Further, while printer magnetic rollers are used in some examples herein, the methods herein are not limited to magnetic rollers, but are applicable to all cylindrical surfaces that are to be patterned.

In one example of digital chemical machining of a magnetic roller, the roller sleeve is coated with a photoresist and exposed to a laser. Rather than traversing a flat surface with a laser, the roller sleeve is rotated under the laser at a fixed rate. Alternately, the roller sleeve can be covered with a transparency of the pattern. The transparency is a photo mask, and the entire roller sleeve is exposed to light to develop the photoresist. The photo mask can be re-used.

After exposure, the photoresist is developed, leaving a protective pattern on the roller sleeve. The exposed portions of the roller sleeve not protected by the protective patterned photoresist are subjected to any known material removal process, such as contact with a suitable acid for a suitable period of time to remove the sleeve material to the desired depth.

Thus, the methods herein can form any desired pattern into the exterior surface of the cylinder. Any pattern can be generated using computerized equipment and the laser or optical mask printing device can reproduce such a pattern with high precision. Such processing is useful because almost any pattern can be recessed into the cylinder/sleeve. For example, the lengthwise dimension of the pattern can contain variability, which is very difficult to achieve with machining, and nearly impossible to achieve with extrusion.

Figure 1:
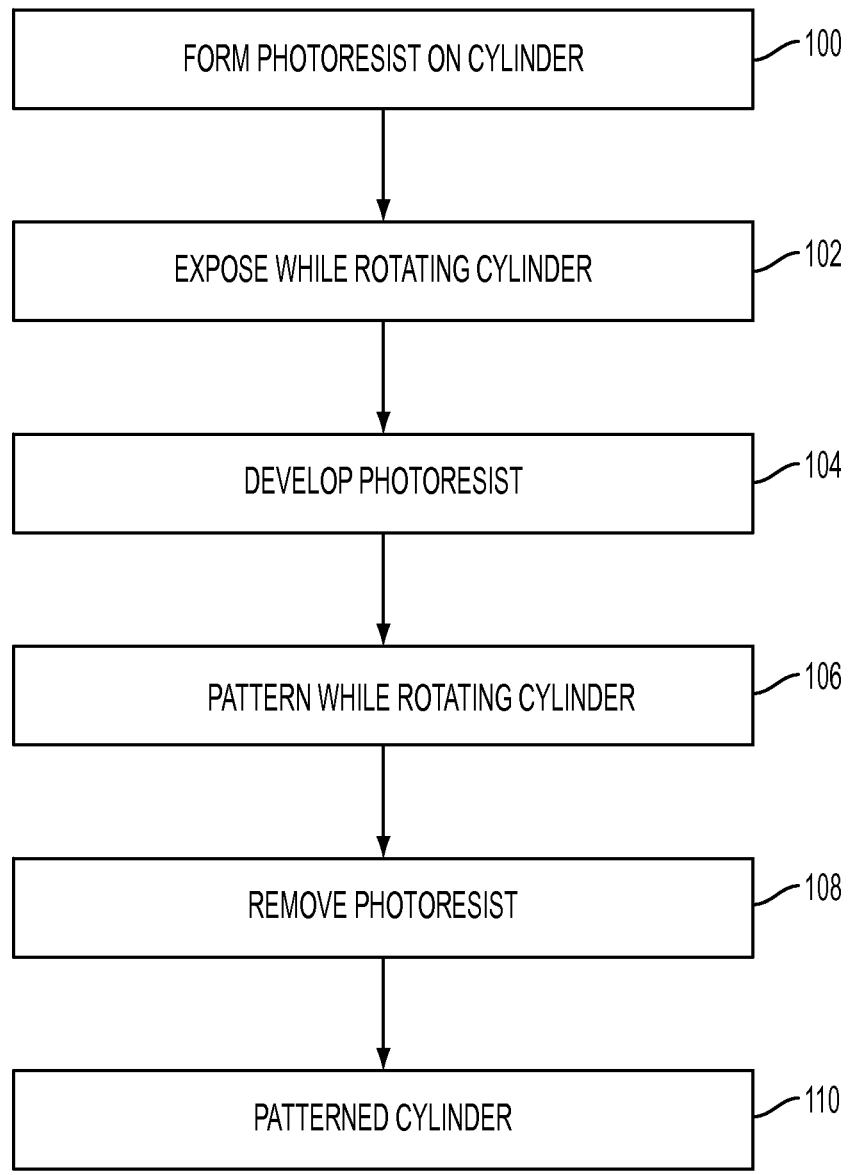
FIG. 1 is a flow diagram of various methods herein.
Figure 2:
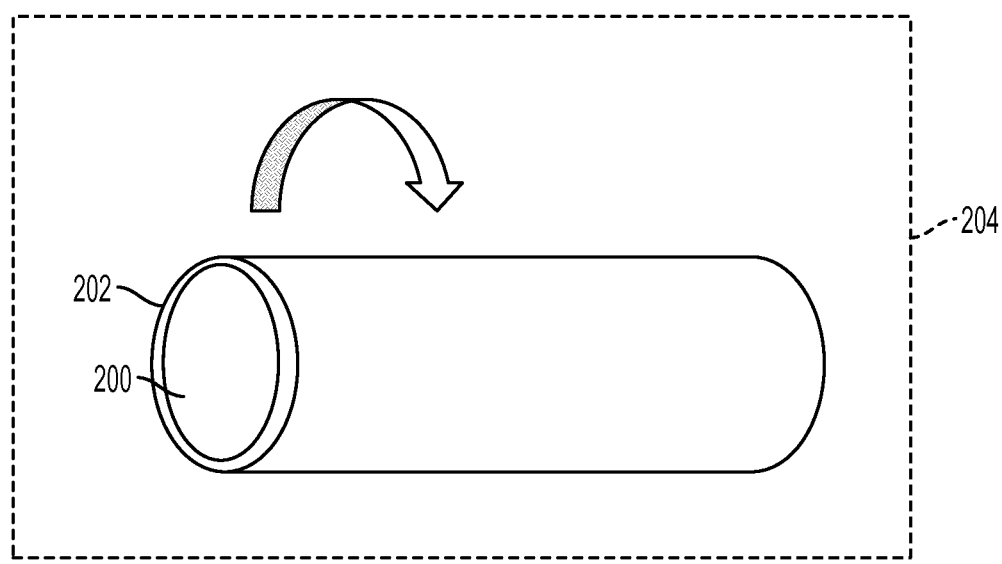
FIG. 2 is a schematic diagram illustrating devices herein.

FIG. 1 is flowchart illustrating exemplary methods herein. In item 100, methods herein form a photoresist (such as an organic photoresist) on a cylinder of any material makeup. In many embodiments the photoresist is formed on the full rotational exterior of the cylinder so that the pattern can be formed around the full circumference of the cylinder.

In item 100, different chemicals may be used as the photoresist, such as poly (methyl methacrylate) (PMMA); poly (methyl glutarimide) (PMGI); phenol formaldehyde resin, diazonaphthoquinone (DNQ), epoxy-based polymers, etc. The specific chemical for the photoresist will vary depending upon the material makeup of the cylinder and the type of material removal process that will be applied to pattern the cylinder. Such chemicals can be applied as a liquid and, generally, the cylinder is rotated during the photoresist formation process to ensure uniformity of thickness of the photoresist. Final thickness of the photoresist can also be determined by the evaporation of liquid solvents from the photoresist. Also, such photoresist chemicals can be applied as a semi-solid film that is laminated onto the cylinder (potentially while it is rotating).

In item 102, such methods expose the photoresist to a light source while rotating the cylinder. Optical lithography can use any type of electromagnetic radiation (referred to herein as "light"), such as ultraviolet light. In this process, the cylinder can be rotated at least one full revolution so that the pattern can be formed into the full circumference of the photoresist. For example, the exposure process 102 can direct a pattern of laser light on the photoresist from a fixed position as the printer magnetic roller rotates. Alternatively, the exposure process can expose a pattern of light on the photoresist through an optical mask (attached or laminated to the cylinder) that surrounds the cylinder from a fixed position as the cylinder rotates. In other embodiments, an optical mask that is separate from the cylinder can be sequentially exposed onto different portions of the photoresist as the cylinder "steps" to different rotational locations (in this way, a single mask can step around the entire circumference of the cylinder as the cylinder is rotated to stepper-pattern the full circumference of the photoresist). A PEB (post-exposure bake) can be performed before developing, typically to help reduce standing wave phenomena caused by the destructive and constructive interference patterns of the incident light.

In item 104, such methods develop the photoresist, after exposing, to change the photoresist into a patterned protective layer (e.g., etching mask) on the exterior of the cylinder. More specifically, the photoresist is developed using a chemical agent, such as sodium hydroxide (NaOH) and metal-ion-free developers such as tetramethylammonium hydroxide (TMAH). The develop chemistry can also be delivered while the cylinder is rotated to ensure uniform application. The developed photoresist can be "hard-baked" if a non-chemically amplified photoresist was used, typically at 120 to 180° C. for 20 to 30 minutes. The hard bake solidifies the remaining photoresist, to make a more durable protecting mask layer This development process changes the physical characteristics of the portion of the photoresist that was exposed to the light. This allows one portion of the photoresist can be rinsed off, leaving the other portion of the photoresist as a protective mask to protect the cylinder exterior surface (which portion of the photoresist that is rinsed off depends upon whether the photoresist is a positive photoresist (illuminated portions remain) or negative photoresist (illuminated portions are rinsed off).

Then, in item 106, with the protective patterned photoresist mask in place, these methods pattern the exterior of the cylinder while rotating the cylinder using the patterned protective layer to produce a patterned cylinder. The patterning process can use any conventional material removal process, such as an acid bath, grit blasting, ion implantation, wet chemical etching, plasma etching, etc. to remove the areas of the cylinder that are not protected by patterned photoresist mask. In such etching, a liquid ("wet") or plasma ("dry") chemical agent removes the material of the cylinder in the areas that are not protected by patterned photoresist mask. Dry etching techniques can be made anisotropic, in order to avoid significant undercutting of the photoresist pattern. In this process, the cylinder can again be rotated at least one full revolution so that the pattern can be formed into the full circumference of the cylinder.

In item 108, the photoresist is removed using a similar chemical rinsing agent leaving the patterned cylinder 110. For example, a liquid "photoresist stripper," which chemically alters the photoresist so that it no longer adheres to the cylinder can be used to remove the photoresist. Alternatively, the photoresist may be removed by a plasma containing oxygen, which oxidizes the photoresist (this process is called ashing, and resembles dry etching).

This processing is also shown in FIGS. 2-5. More specifically, in FIG. 2, a photoresist 202 is formed on the exterior of a cylinder 200 (having a fixed magnetic core, for example). As mentioned above, various organic chemicals can be used and such chemicals can be applied as a liquid, a semi-solid film, etc., and such may be applied within an application chamber or chemical tank 204. As shown by the arrow in FIG. 2, the cylinder can be rotated during the photoresist formation process to ensure uniformity of thickness of the photoresist.

Figure 3:
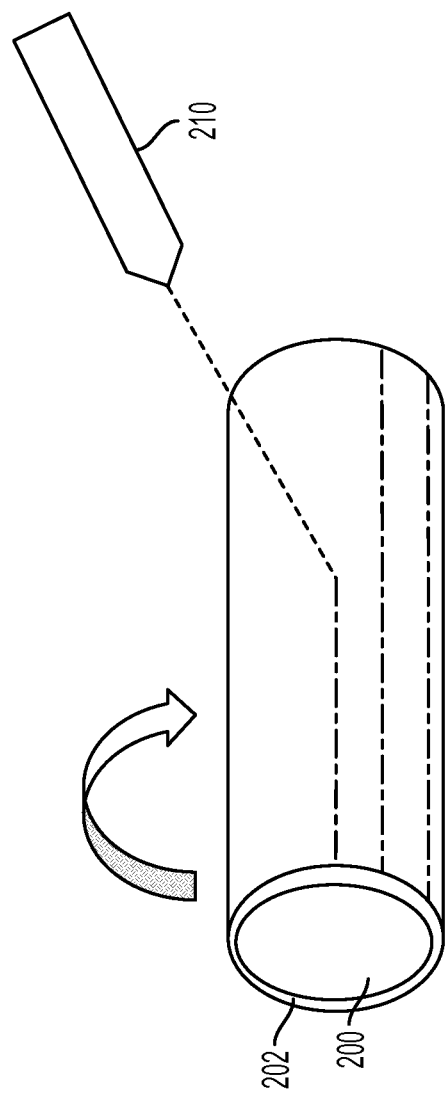
FIG. 3 is a schematic diagram illustrating devices herein.
Figure 4:
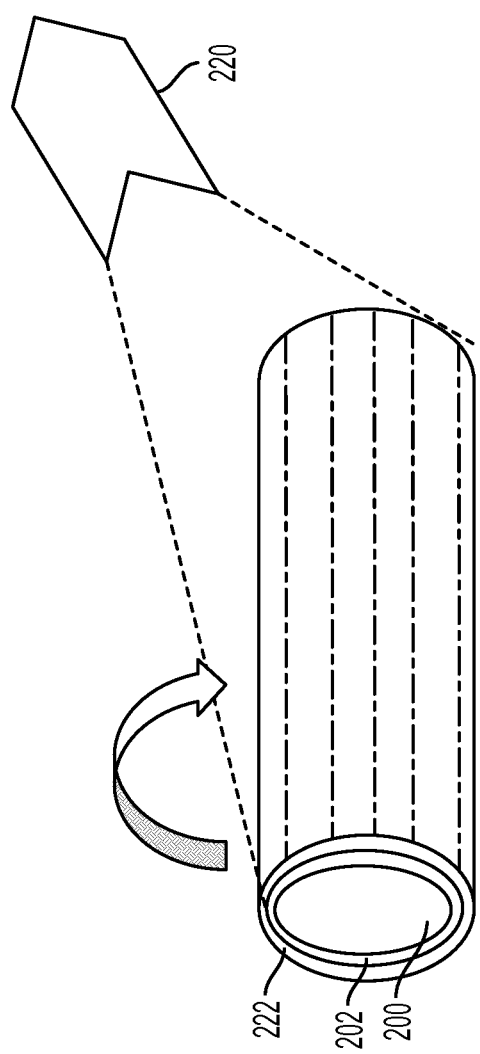
FIG. 4 is a schematic diagram illustrating devices herein.

As mentioned above, a light source is used to expose the photoresist 202 while the cylinder 200 is rotated. As shown in FIG. 3, the light source can be a laser 210 that directs a pattern of light under control of a computer on the photoresist 202 from a fixed position (as the cylinder rotates). Alternatively, as shown in FIG. 4, a contact or non-contact optical mask 220 can formed to surround the cylinder and the exposure process uses a broadcast light 222 located at a fixed position to expose the photoresist through the optical mask 220 as the cylinder rotates (e.g., at least one full revolution). While single light sources are illustrated to avoid clutter in the drawings, multiple light sources of each type could be used and the light sources can be in a fixed position or can move with respect to the position of the rotating cylinder.

Figure 5:
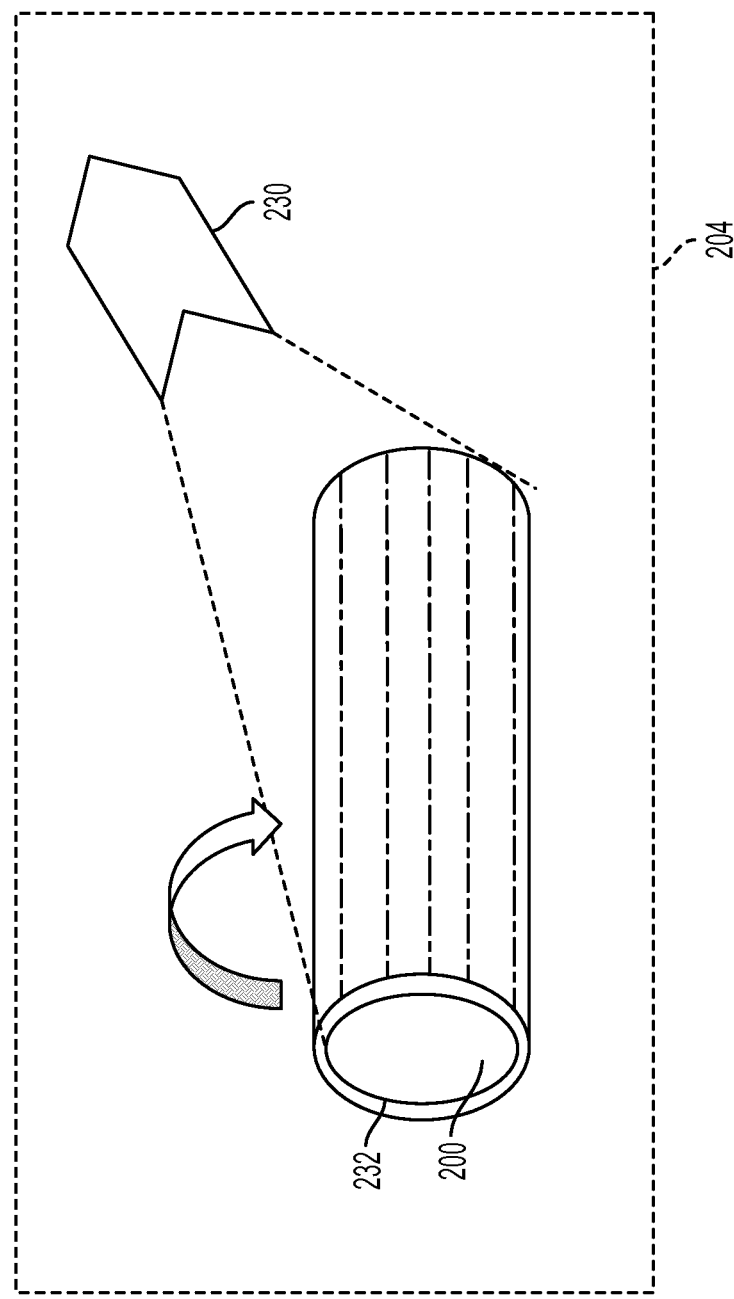
FIG. 5 is a schematic diagram illustrating devices herein.

Such methods develop the photoresist, after exposing, to produce a patterned protective mask layer 232 (shown in FIG. 5) on the exterior of the cylinder. Then, as shown in FIG. 5, such methods perform any material removal process using any form of an application device 230 (such as a grit dispenser, plasma generator, etc.) to pattern the exterior of the cylinder while rotating the cylinder (e.g., at least one full revolution). These methods use the patterned protective layer 232 as a mask to protect the covered portions of the cylinder, and allow portions of the exterior surface of the cylinder not protected by the patterned protective photoresist mask to be removed (down to a depth controlled by processing power and time).

Figure 6:
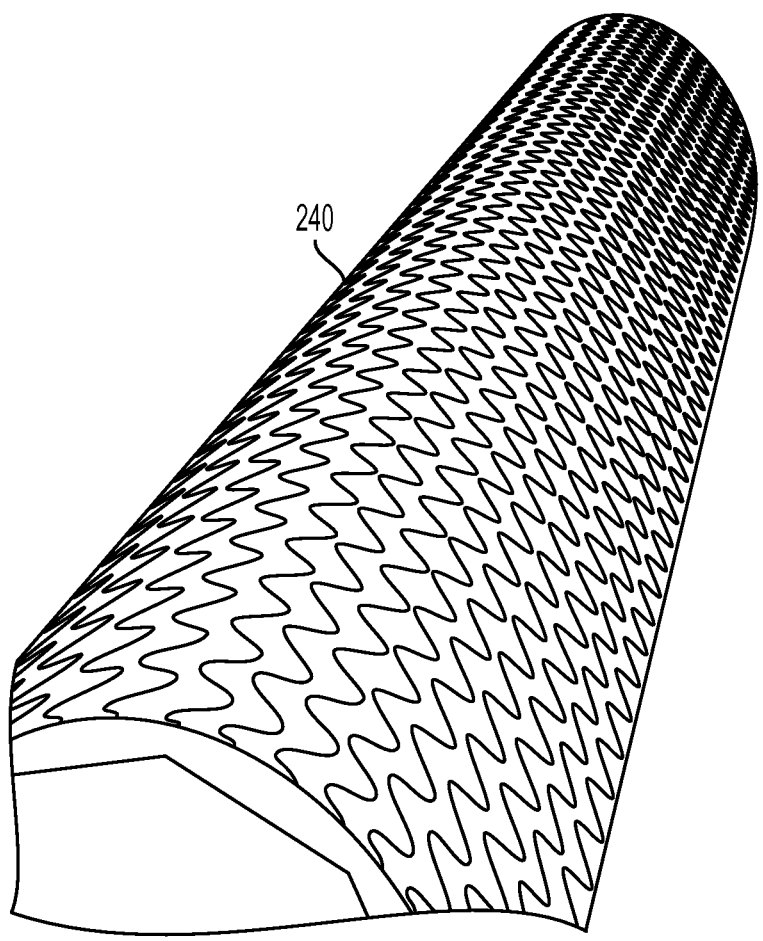
FIG. 6 is a schematic diagram illustrating devices herein.
Figure 7:
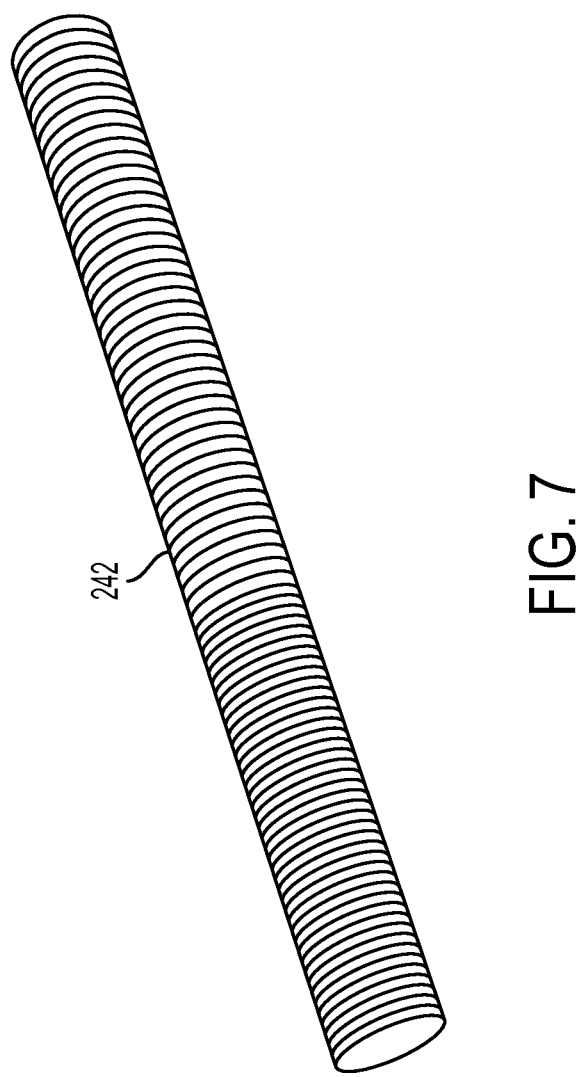
FIG. 7 is a schematic diagram illustrating devices herein.

After the protective photoresist mask is removed, a patterned cylinder, such as items 240 and 242 having different patterns of grooves in the cylinder surface remains, as shown in FIGS. 6 and 7, discussed below. The photoresist development, photoresist removal, and material removal processes described above can also be performed in an application chamber/chemical tank 204 depending upon whether wet or dry processing is being performed.

The sleeve/cylinder surface 240 shown in FIG. 6 contains an exemplary pattern of trenches or grooves that is derived from the mathematical equation y=a*sin (b*x) where x is the lengthwise distance of the drum, a is amplitude and period of (p)=2 pi/b. Frequency (f)=1/p. It would not be possible to produce this pattern using machining or extrusion, but such is easily produced by the photolithography processing described above.

The pattern cut into the surface of the cylinder can be varied to produce a transfer function that provides the optimal mass on roll at the lowest possible visible noise. In the case of y=a sin (b*x), a 3 factor design of sinusoidal frequency, amplitude and groove spacing can be used to provide a transfer function with optimal design parameters. Other equations can be used to define the groove, y=a sin (b*x) is merely 1 example.

Further, as shown in the patterned cylinder 242 in FIG. 7, the patterns can vary along the length of the roll to induce directional flow of the material. In this example, the patterned cylinder 242 has a helix pattern of increasing pitch. This pattern causes the material to flow towards one end of the cylinder 242. This is often useful to keep fresh toner and development material in the development nip and move old material to the waste auger.

It will be appreciated that the above-disclosed and other features and functions, or alternatives thereof, may be desirably combined into many other different devices or applications. Various presently unforeseen or unanticipated alternatives, modifications, variations, or improvements therein may be subsequently made by those skilled in the art which are also intended to be encompassed by the following claims. Unless specifically defined in a specific claim itself, steps or components of the devices and methods herein cannot be implied or imported from any above example as limitations to any particular order, number, position, size, shape, angle, color, or material.

What is claimed is:

1. A method comprising:
   forming a photoresist on a full rotational exterior of a printer magnetic roller;
   exposing said photoresist to a light source while rotating said printer magnetic roller at least one full revolution;
   developing said photoresist after said exposing to change said photoresist into a patterned protective layer on said full rotational exterior of said printer magnetic roller; and
   patterning grooves in said full rotational exterior of said printer magnetic roller while rotating said printer magnetic roller at least one full revolution using said patterned protective layer to produce a patterned printer magnetic roller.

2. The method according to claim 1, said exposing comprising directing a pattern of laser light on said photoresist from a fixed position as said printer magnetic roller rotates.

3. The method according to claim 1, said exposing comprising exposing a pattern of light on said photoresist through an optical mask surrounding said printer magnetic roller from a fixed position as said printer magnetic roller rotates.

4. The method according to claim 1, said patterning comprising forming a pattern of grooves that varies along a length of said printer magnetic roller to induce directional flow of toner on said patterned printer magnetic roller.

5. The method according to claim 1, said patterning comprising forming a pattern of grooves comprising a helix pattern of grooves of increasing pitch on said exterior of said printer magnetic roller.

6. The method according to claim 5, said helix pattern of grooves of increasing pitch causing toner on said patterned printer magnetic roller to flow towards one end of said patterned printer magnetic roller.

7. A printer magnetic roller comprising:
   a fixed magnetic core; and
   a cylinder surrounding said fixed magnetic core,
   said cylinder having an exterior surface,
   said exterior surface having a pattern of grooves that varies along a length of said printer magnetic roller to induce directional flow of toner on said exterior surface.

8. The printer magnetic roller according to claim 7, said pattern of grooves comprising a pattern that varies along a length of said exterior surface to induce directional flow of toner on said exterior surface.

9. The printer magnetic roller according to claim 7, said pattern of grooves comprising a helix pattern of increasing pitch on said exterior surface.

10. The printer magnetic roller according to claim 9, said helix pattern of increasing pitch causing toner on said printer magnetic roller to flow towards one end of said exterior surface.

11. The printer magnetic roller according to claim 7, said pattern of grooves comprising a sinusoidal frequency, amplitude, and groove spacing producing a transfer function of toner that provides optimal mass on roller (MOR).

12. A method comprising:
    forming a photoresist on a full rotational exterior of a printer magnetic roller;
    exposing said photoresist to a light source while rotating said printer magnetic roller at least one full revolution;
    developing said photoresist after said exposing to change said photoresist into a patterned mask on said full rotational exterior of said printer magnetic roller;
    patterning grooves in said full rotational exterior of said printer magnetic roller using a material removal process while rotating said printer magnetic roller at least one full revolution using said patterned mask to produce a patterned printer magnetic roller having patterned grooves; and
    removing said patterned mask from said exterior of said printer magnetic roller after said patterning grooves.

13. The method according to claim 12, said exposing comprising directing a pattern of laser light on said photoresist from a fixed position as said printer magnetic roller rotates.

14. The method according to claim 12, said exposing comprising exposing a pattern of light on said photoresist through an optical mask surrounding said printer magnetic roller from a fixed position as said printer magnetic roller rotates.

15. The method according to claim 12, said patterning comprising forming a pattern that varies along a length of said printer magnetic roller to induce directional flow of toner on said patterned printer magnetic roller.

16. The method according to claim 12, said patterning comprising forming a pattern of grooves comprising a helix pattern of grooves of increasing pitch on said exterior of said printer magnetic roller.

17. The method according to claim 16, said helix pattern of increasing pitch causing toner on said patterned printer magnetic roller to flow towards one end of said patterned printer magnetic roller.

18. A printer magnetic roller comprising:
    a fixed magnetic core; and
    a cylinder surrounding said fixed magnetic core,
    said cylinder having an exterior surface,
    said exterior surface having a pattern of grooves that varies along a length of said printer magnetic roller to induce directional flow of toner on said exterior surface.

19. The printer magnetic roller according to claim 18, said pattern of grooves comprising a pattern of grooves that varies along a length of said exterior surface to induce directional flow of toner on said exterior surface.

20. The printer magnetic roller according to claim 18, said pattern of grooves comprising a helix pattern of grooves of increasing pitch on said exterior surface.

21. The printer magnetic roller according to claim 20, said helix pattern of increasing pitch causing toner on said printer magnetic roller to flow towards one end of said exterior surface.

22. The printer magnetic roller according to claim 18, said pattern of grooves comprising a sinusoidal frequency, amplitude, and groove spacing producing a transfer function of toner that provides optimal mass on roller (MOR).

* * * * *